United States Patent
Fabrega-Sanchez et al.

(10) Patent No.: US 7,180,467 B2
(45) Date of Patent: Feb. 20, 2007

(54) SYSTEM AND METHOD FOR DUAL-BAND ANTENNA MATCHING

(75) Inventors: Jorge Fabrega-Sanchez, San Diego, CA (US); Gregory Poilasne, San Diego, CA (US); Stanley S. Toncich, San Diego, CA (US); Allen Tran, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 0 days.

(21) Appl. No.: 10/899,278

(22) Filed: Jul. 26, 2004

(65) Prior Publication Data

US 2004/0263411 A1    Dec. 30, 2004

Related U.S. Application Data

(63) Continuation-in-part of application No. 10/117,628, filed on Apr. 4, 2002, now Pat. No. 6,861,985, and a continuation-in-part of application No. 10/120,603, filed on Apr. 9, 2002, now Pat. No. 6,885,341, and a continuation-in-part of application No. 10/075,896, filed on Feb. 12, 2002, now Pat. No. 6,765,540.

(51) Int. Cl.
    *H01Q 1/50* (2006.01)
(52) U.S. Cl. .................... 343/861; 455/575.7
(58) Field of Classification Search ............... 343/850, 343/860, 745, 861; 455/575.7
    See application file for complete search history.

(56) References Cited

U.S. PATENT DOCUMENTS

| | | | |
|---|---|---|---|
| 3,239,838 A | 3/1966 | Kelleher | |
| 3,413,543 A | 11/1968 | Schubring et al. | |
| 3,569,795 A | 3/1971 | Gikow | |
| 3,676,803 A | 7/1972 | Simmons | |
| 3,678,305 A | 7/1972 | Paige | |

(Continued)

FOREIGN PATENT DOCUMENTS

DE    40 36 866 A1    7/1991

(Continued)

OTHER PUBLICATIONS

Presser, A., "Varactor-Tunable, High-Q Microwave Filter," RCA Review, vol. 42, Dec. 1981, pp. 691-705.

(Continued)

*Primary Examiner*—Michael C. Wimer

(57) ABSTRACT

A dual-band antenna matching system and a method for dual-band impedance matching are provided. The method comprises: accepting a frequency-dependent impedance from an antenna; and, selectively supplying a conjugate impedance match for the antenna at either a first and a second communication band, or a third and a fourth communication band. More specifically, the method comprises: tuning a first tuning circuit to a first frequency; and, simultaneously tuning a second tuning circuit to a second frequency. In response, a conjugate match is supplied to the antenna in the first communication band in response to the first frequency. Simultaneously, the antenna is matched in the second communication band in response to the second frequency. When the first tuning circuit is tuned to a third frequency, and the second tuning circuit is tuned to a fourth frequency, then conjugate matches are supplied for the third and fourth communication bands, responsive to the third and fourth frequencies, respectively.

24 Claims, 7 Drawing Sheets

U.S. PATENT DOCUMENTS

| | | | |
|---|---|---|---|
| 3,680,135 A * | 7/1972 | Boyer | 343/742 |
| 3,737,814 A | 6/1973 | Pond | |
| 3,739,299 A | 6/1973 | Adler | |
| 3,836,874 A | 9/1974 | Maeda | |
| 3,918,012 A | 11/1975 | Peuzin | |
| 4,122,400 A | 10/1978 | Medendorp et al. | |
| 4,236,125 A | 11/1980 | Bernard et al. | |
| 4,475,108 A | 10/1984 | Moser | |
| 4,484,157 A | 11/1984 | Helle et al. | |
| 4,494,081 A | 1/1985 | Lea et al. | |
| 4,525,720 A | 6/1985 | Corzine et al. | |
| 4,626,800 A | 12/1986 | Murakami et al. | |
| 4,733,328 A | 3/1988 | Blazej | |
| 4,736,169 A | 4/1988 | Weaver et al. | |
| 4,737,797 A | 4/1988 | Siwiak et al. | |
| 4,746,925 A | 5/1988 | Toriyama | |
| 4,792,939 A | 12/1988 | Hikita et al. | |
| 4,799,066 A | 1/1989 | Deacon | |
| 4,835,499 A | 5/1989 | Pickett | |
| 4,835,540 A | 5/1989 | Haruyama et al. | |
| 4,847,626 A | 7/1989 | Kahler et al. | |
| 4,975,604 A | 12/1990 | Barta | |
| 5,166,857 A | 11/1992 | Avanic et al. | |
| 5,173,709 A | 12/1992 | Lauro et al. | |
| 5,212,463 A | 5/1993 | Babbitt et al. | |
| 5,216,392 A | 6/1993 | Fraser et al. | |
| 5,227,748 A | 7/1993 | Sroka | |
| 5,231,407 A | 7/1993 | McGirr et al. | |
| 5,293,408 A | 3/1994 | Takahashi et al. | |
| 5,307,033 A | 4/1994 | Koscica et al. | |
| 5,325,099 A | 6/1994 | Nemit et al. | |
| 5,388,021 A | 2/1995 | Stahl | |
| 5,406,163 A | 4/1995 | Carson et al. | |
| 5,416,803 A | 5/1995 | Janer | |
| 5,427,988 A | 6/1995 | Sengupta et al. | |
| 5,450,092 A | 9/1995 | Das | |
| 5,451,915 A | 9/1995 | Katzin et al. | |
| 5,459,123 A | 10/1995 | Das | |
| 5,472,935 A | 12/1995 | Yandrofski et al. | |
| 5,479,139 A | 12/1995 | Koscica et al. | |
| 5,495,215 A | 2/1996 | Newell et al. | |
| 5,496,795 A | 3/1996 | Das | |
| 5,496,796 A | 3/1996 | Das | |
| 5,502,422 A | 3/1996 | Newell et al. | |
| 5,525,942 A | 6/1996 | Horii et al. | |
| 5,557,286 A | 9/1996 | Varadan et al. | |
| 5,561,307 A | 10/1996 | Mihara et al. | |
| 5,561,407 A | 10/1996 | Koscica et al. | |
| 5,564,086 A | 10/1996 | Cygan et al. | |
| 5,574,410 A | 11/1996 | Collins et al. | |
| 5,577,025 A | 11/1996 | Skinner | |
| 5,583,524 A | 12/1996 | Milroy | |
| 5,589,845 A | 12/1996 | Yandrofski et al. | |
| 5,600,279 A | 2/1997 | Mori | |
| 5,617,104 A | 4/1997 | Das | |
| 5,640,042 A | 6/1997 | Koscica et al. | |
| 5,649,306 A | 7/1997 | Vanatta et al. | |
| 5,652,599 A | 7/1997 | Pitta et al. | |
| 5,673,188 A | 9/1997 | Lusher et al. | |
| 5,701,595 A | 12/1997 | Green, Jr. | |
| 5,721,194 A | 2/1998 | Yandrofski et al. | |
| 5,729,239 A | 3/1998 | Rao | |
| 5,777,524 A | 7/1998 | Wojewoda et al. | |
| 5,777,839 A | 7/1998 | Sameshina et al. | |
| 5,778,308 A | 7/1998 | Sroka et al. | |
| 5,830,591 A | 11/1998 | Sengupta et al. | |
| 5,834,975 A | 11/1998 | Bartlett et al. | |
| 5,864,932 A | 2/1999 | Evans et al. | |
| 5,870,670 A | 2/1999 | Ripley | |
| 5,880,921 A | 3/1999 | Tham et al. | |
| 5,892,486 A | 4/1999 | Cook et al. | |
| 5,908,811 A | 6/1999 | Das | |
| 5,945,887 A | 8/1999 | Makino et al. | |
| 5,965,494 A | 10/1999 | Terashima et al. | |
| 5,973,567 A | 10/1999 | Heal et al. | |
| 5,973,568 A | 10/1999 | Shapiro et al. | |
| 5,986,515 A | 11/1999 | Sakurai | |
| 5,987,314 A | 11/1999 | Salto | |
| 5,990,766 A | 11/1999 | Zhang | |
| 6,008,659 A | 12/1999 | Traynor | |
| 6,018,282 A | 1/2000 | Tsuda | |
| 6,020,787 A | 2/2000 | Kim et al. | |
| 6,026,311 A | 2/2000 | Willemsen Cortes et al. | |
| 6,028,561 A | 2/2000 | Takei | |
| 6,049,726 A | 4/2000 | Gruenwald et al. | |
| 6,052,036 A | 4/2000 | Enstrom et al. | |
| 6,054,908 A | 4/2000 | Jackson | |
| 6,063,719 A * | 5/2000 | Sengupta et al. | 501/137 |
| 6,094,588 A | 7/2000 | Adam | |
| 6,097,263 A | 8/2000 | Mueller et al. | |
| 6,101,102 A | 8/2000 | Brand et al. | |
| 6,108,191 A | 8/2000 | Bruchhaus et al. | |
| 6,160,524 A | 12/2000 | Wilber | |
| 6,181,777 B1 | 1/2001 | Kiko | |
| 6,198,441 B1 | 3/2001 | Okabe | |
| 6,216,020 B1 | 4/2001 | Findikoglu | |
| 6,242,843 B1 | 6/2001 | Pohjonen et al. | |
| 6,272,336 B1 | 8/2001 | Appel et al. | |
| 6,278,383 B1 | 8/2001 | Endo et al. | |
| 6,281,023 B2 | 8/2001 | Eastep et al. | |
| 6,281,534 B1 | 8/2001 | Arita et al. | |
| 6,285,337 B1 | 9/2001 | West et al. | |
| 6,292,143 B1 | 9/2001 | Romanofsky | |
| 6,294,964 B1 | 9/2001 | Satoh | |
| 6,308,051 B1 | 10/2001 | Atokawa | |
| 6,327,463 B1 | 12/2001 | Welland | |
| 6,329,959 B1 | 12/2001 | Varadan et al. | |
| 6,333,719 B1 | 12/2001 | Varadan | |
| 6,335,710 B1 | 1/2002 | Falk et al. | |
| 6,344,823 B1 | 2/2002 | Deng | |
| 6,359,444 B1 | 3/2002 | Grimes | |
| 6,362,784 B1 | 3/2002 | Kane et al. | |
| 6,362,789 B1 | 3/2002 | Trumbull et al. | |
| 6,384,785 B1 | 5/2002 | Kamogawa et al. | |
| 6,404,304 B1 | 6/2002 | Kwon et al. | |
| 6,456,236 B1 | 9/2002 | Hauck et al. | |
| 6,462,628 B2 | 10/2002 | Kondo et al. | |
| 6,489,860 B1 | 12/2002 | Ohashi | |
| 6,503,786 B2 | 1/2003 | Klodzinski | |
| 6,518,850 B1 | 2/2003 | Falk et al. | |
| 6,518,920 B2 | 2/2003 | Proctor, Jr. et al. | |
| 6,522,220 B2 | 2/2003 | Yamada et al. | |
| 6,525,630 B1 | 2/2003 | Zhu et al. | |
| 6,525,691 B2 | 2/2003 | Varadan et al. | |
| 6,531,936 B1 | 3/2003 | Chiu et al. | |
| 6,559,737 B1 | 5/2003 | Nagra et al. | |
| 6,571,110 B1 | 5/2003 | Patton et al. | |
| 6,600,456 B2 | 7/2003 | Gothard et al. | |
| 6,653,977 B1 | 11/2003 | Okabe et al. | |
| 6,667,723 B2 | 12/2003 | Forrester | |
| 6,686,817 B2 | 2/2004 | Zhu et al. | |
| 6,721,293 B1 | 4/2004 | Komulainen et al. | |
| 6,727,535 B1 | 4/2004 | Sengupta et al. | |
| 2001/0026243 A1 | 10/2001 | Koitsalu et al. | |
| 2001/0043159 A1 | 11/2001 | Masuda et al. | |
| 2002/0049064 A1 | 4/2002 | Banno | |
| 2002/0149526 A1 | 10/2002 | Tran et al. | |
| 2002/0149535 A1 | 10/2002 | Toncich | |
| 2002/0175878 A1 | 11/2002 | Toncich | |
| 2003/0062971 A1 | 4/2003 | Toncich | |
| 2003/0134665 A1 | 7/2003 | Kato et al. | |
| 2004/0196121 A1 | 10/2004 | Toncich | |
| 2004/0263411 A1 | 12/2004 | Fabrega-Sanchez et al. | |

| | | |
|---|---|---|
| 2005/0007291 A1 | 1/2005 | Fabrega-Sanchez et al. |

FOREIGN PATENT DOCUMENTS

| | | |
|---|---|---|
| DE | 100 24 483 | 11/2001 |
| DE | 101 37 753 | 2/2003 |
| EP | 0 125 586 | 11/1984 |
| EP | 0 346 089 | 12/1989 |
| EP | 0 473 373 | 3/1992 |
| EP | 0 531 125 | 3/1993 |
| EP | 0 631 399 | 12/1994 |
| EP | 0 637 131 A1 | 2/1995 |
| EP | 0 638 953 A1 | 2/1995 |
| EP | 0 680 108 A1 | 11/1995 |
| EP | 0 795 922 A1 | 9/1997 |
| EP | 0 843 374 A2 | 5/1998 |
| EP | 0 854 567 | 7/1998 |
| EP | 0 872 953 | 10/1998 |
| EP | 0 881 700 A1 | 12/1998 |
| EP | 0 892 459 | 1/1999 |
| EP | 0 909 024 A2 | 4/1999 |
| EP | 1 043 741 A2 | 10/2000 |
| EP | 1 058 333 | 12/2000 |
| EP | 1 248 317 | 10/2002 |
| GB | 2 240 227 | 7/1991 |
| JP | 63 128618 | 6/1988 |
| JP | 05182857 | 7/1993 |
| JP | 290500-2001133839 | 7/2001 |
| WO | WO 82/03510 | 10/1982 |
| WO | WO 94/13028 | 6/1994 |
| WO | WO 94/27376 | 11/1994 |
| WO | WO 00/28613 | 5/2000 |
| WO | WO 00/35042 | 6/2000 |
| WO | WO 00/62367 | 10/2000 |
| WO | WO 00/79645 A1 | 12/2000 |
| WO | WO 00/79648 A1 | 12/2000 |
| WO | WO 03/058759 | 7/2001 |
| WO | WO 02/084798 | 10/2002 |

OTHER PUBLICATIONS

Chang, C. et al., "Microwave Active Filters Based on Coupled Negative Resistance Method," IEEE Trans. on Microwave Theory & Techs., vol. 38, No. 12, Dec. 1990, pp. 1879-1884.

Katzin, P. et al., "Narrow-band MMIC Filters with Automatic Tuning and Q-Factor Control," 1993 IEEE MTT-S Int. Microwave Symposium Digest, pp. 403-406.

Hopf, B. et al., "Coplanar MMIC Active Bandpass Filters Using Negative Resistance Circuits," 1994 IEEE MTT-S Symposium Digest, pp. 1183-1185.

Karacaoglu, U. et al., "High Selectivity Varactor-Tuned MMIC Bandpass Filter Using Lossless Active Resonators," 1994 IEEE MTT-Symposium Digest, pp. 1191-1194.

Nauta, B., "A CMOS Transconductance-C Filter Technique for Very High Frequencies," IEEE Journal of Solid-State Circuits, vol. 27, No. 2, Feb. 1992, pp. 142-153.

Fujita, K. et al., "A 15.6 GHz Commercially Based 1/8 GaAs Dynnamic Presealer," 1989 IEEE GaAs IC Symposium, pp. 113-116.

Smuk, J. et al., "MMIC Phase Locked L-S Band Oscillators," 1994 IEEE GaAs Symposium Digest, pp. 27-29.

Chandler, S.R. et al., "Active Varactor Tunable Bandpass Filter," IEEE Microwave and Guided Wave Letters, vol. 3, No. 3, Mar. 1993, pp. 70-71.

Hunter, I.C. et al., "Electronically Tunable Microwave Bandpass Filters," IEEE Trans. on MTT, vol. 30, No. 9, Sep. 1982, pp. 1354-1367.

Toyoda, S., "Quarter-wavelength Coupled Variable Bandstop and Bandpass Filters Using Varactor Diodes," IEEE Trans. on MTT, vol. 30, No. 9, Sep. 1982, pp. 1387-1389.

Yu, B., "Variety of Approaches to Designing Microwave Active Filters," Proc. 27th European Microwave Conference, Jerusalem, vol. 1, 1997, pp. 397-408.

Yu, B., "Understand the Operation of Channelized Active Filters," Microwaves & RF, Jan. 1997, pp. 89-92.

Dishal, M., "Alignment and Adjustment of Synchronously Tuned Multiple Resonator-Circuit Filters," Proc. IRE 39, Nov. 1951, pp. 1448-1455.

Cohn, S.B., "Dissipation Loss in Multiple-Coupled-Resonator Filters," Proc. IRE 47, Aug. 1959, pp. 1342-1348.

Matthael, G.L., "An Electronically Tunable Up-Converter," Proc. IRE 49, Nov. 1961, pp. 1703-1704.

Fubini, E.G. et al., "Minimum Insertion Loss Filters," Proc. IRE 47, Jan. 1959, pp. 37-41.

Getsinger, W.J., "Prototypes for Use in Broadbanding Reflection Amplifiers," IEEE Trans. PTGMTT-11, Nov. 1963, pp. 486-497.

Kuh, E.S. et al., "Optimum Sunthesis of Wide-Band Parametric Amplifiers and Converters," IRE Trans. PCCT-8, Dec. 1961, pp. 410-415.

Getsinger, W.J. et al., "Some Aspects of the Design of Wide-Band Up-Converters and Nondegenerate Parametric Amplifiers," IEEE Trans. PTGMTT-12, Jan. 1964, pp. 77-87.

Sleven, R.L., "Design of a Tunable Multi-Cavity Waveguide Band-Pass Filter," 1959 IRE National Convention Record, Part 3, pp. 91-112.

Taub, J.J. et al., "Design of Three-Resonator Dissipative Band-Pass Filters Having Minimum Insertion Loss," Proc. IRE 45, pp. 681-687 (May 1957).

Kotzebue, K.L., "Broadband Electronically-Tunable Microwave Filters," 1960 IRE Wescon Convention Record, Part 1, pp. 21-27.

Louhos, J.P. et al., "Electrical Tuning of Integrated Mobile Phone Antennas," Nokia Mobile Phones, pp. 69-97 (Sep. 15, 1999).

Panayi, P.K. et al., "Tuning Techniques for the Planar Inverted-F Antenna," National Conference on Antennas and Propagation Publication, No. 461, pp. 259-262, (Apr. 1999).

Makioka, S. et al., "A High Efficiency GaAs MCM Power Amplifier for 1.9 GHz Digital Cordless Telephones," IEEE 1994 Microwave & Millimeter-Wave Monolithic Cir. Sym., pp. 51-54.

Varadan, V.K. et al., "Design and Development of Electronically Tunable Microstrip Antennas," IOPR Publishing Ltd., pp. 238-242, (1999).

Communication Relating to the Results of the Partial International Search: PCT/IB02/01077 (2002).

Jose et al., "Experimental Investigations on Electronically Tunable Microstrip Antennas," Microwave and Optical Technology Letters, vol. 20, No. 3, pp. 166-169 (Feb. 5, 1999).

International Search Report: PCT/IB 02/01086 (Jun. 24, 2002).
International Search Report: PCT/IB 02/01078 (Jul. 10, 2002).
International Search Report: PCT/IB 02/01087 (Jul. 11, 2002).
International Search Report: PCT/IB 02/01107 (Jul. 11, 2002).
International Search Report: PCT/IB 02/01120 (Jul. 11, 2002).
International Search Report: PCT/IB 02/01098 (Jul. 4, 2002).
International Search Report: PCT/IB 02/01082 (Jul. 8, 2002).
International Search Report: PCT/IB 02/01144 (Jul. 12, 2002).
International Search Report: PCT/IB 02/01026 (Jun. 28, 2002).
International Search Report: PCT/IB 02/01027 (Jun. 25, 2002).

Cuthbert, T., "Broadband Impedance Matching -Fast and Simple", RF Design, Cardiff Publishing Co., vol. 17, No. 12, Nov. 1994, pp. 38, 42, 44, 48, XP000477834.

Erker et al., "Monolithic Ka-Band Phase Shifter Using Voltage Tunable BaSrTiO3 Parallel Plate Capacitors", IEEE Microwave and Guided Wave Letters, IEEE Inc., vol. 10, No. 1, Jan. 2000, pp. 10-12 XP-000930368.

Galt, D. et al., "Ferroelectric Thin Film Characterization Using Superconducting Microstrip.Resonators", IEEE Trans on Appl Superconductivity Jun. 1995 IEEE, pp. 2575-2578, vol. 5, No. 2, Piscataway, NJ, USA.

Gevorgian, Spartak S. et al., "HTS/Ferroelectric Devices for Microwave Applications", IEEE Transactions on Applied Superconductivity, Jun. 1997, pp. 2458-2461, IEEE, USA.

Keis, V. N. et al., "20GHz tunable filter based on ferroelectric (BaSr)TiO3 film varactors", Electronics Letters, May 28, 1998, vol. 34, No. 11, IEE Stevenage, GB.

Kotzebue, K.L., "Broadband Electronically-Tunable Microwave Filters," 1960 IRE Wescon Convention Record, Part 1, pp. 21-27.

Krautkramer, V.W. et al., "Resonanztransformatoren mit drei Reaktanzen als transformierende Filter", Bulletin des Schweizerischen Elektrotechnischen Vereins, Zurich, CH, vol. 64, No. 23, Nov. 10, 1973, pp. 1500-1509, XP002184530.

Toncich et al., "Data Reduction Method for Q Measurements of Stripline Resonators", IEEE Transactions in MTT, vol. 40, No. 9, Sep. 1992, pp. 1833-1836.

Vendik, O.G. et al., "1GHz tunable resonator on bulk single crystal SrTiO3 plated with Yba2Cu307-x films", Electronics Letters, Apr. 13, 1995, pp. 654-656, vol. 31, No. 8, IEE Stevenage, GB.

International Search Report: PCT/US2005/025557 (Nov. 3, 2005).

* cited by examiner

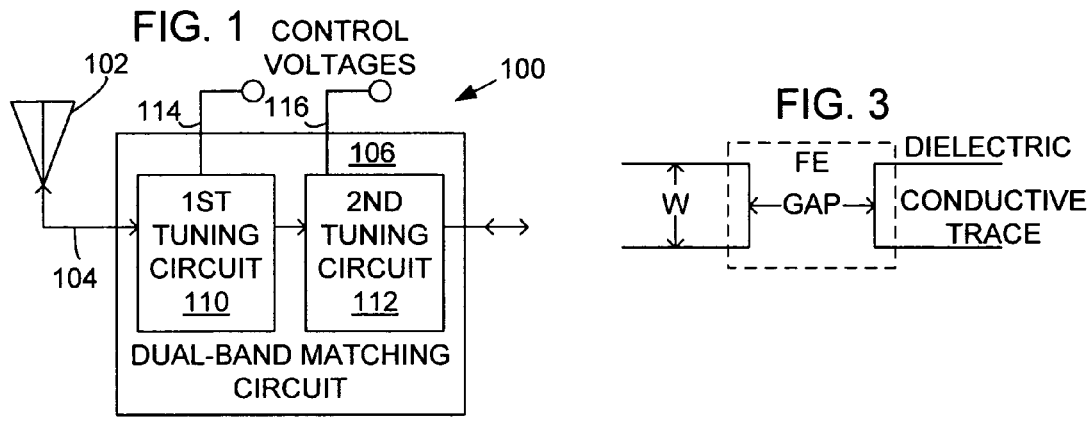
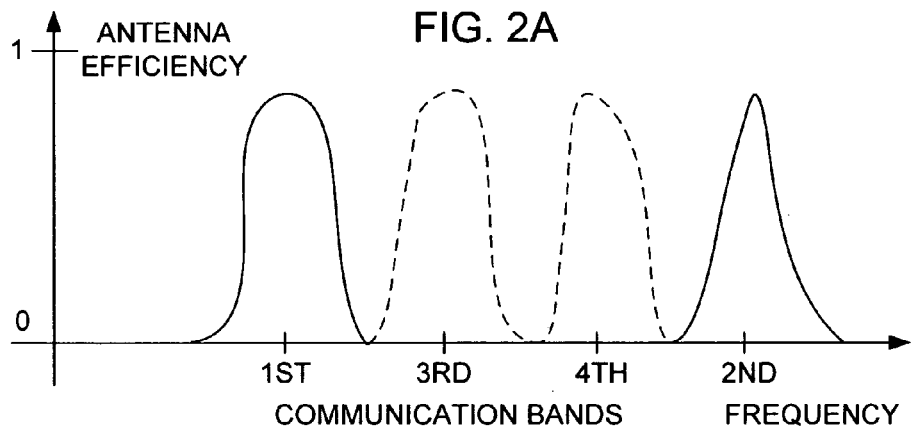
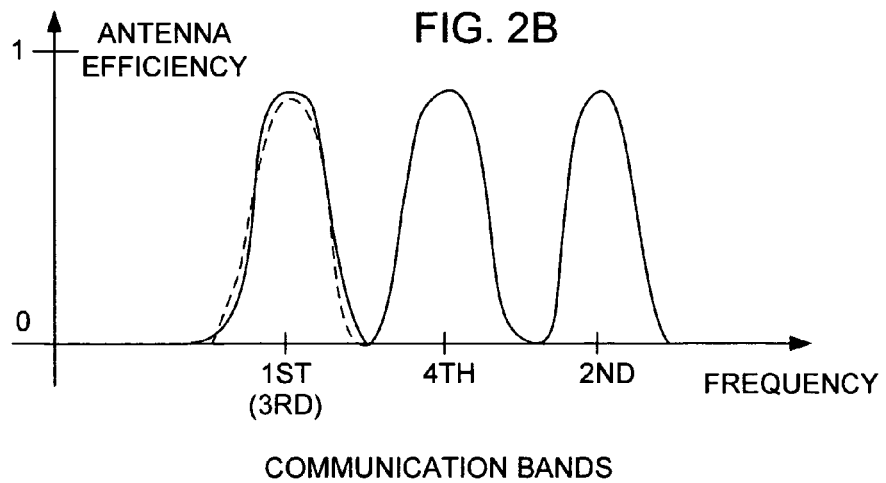

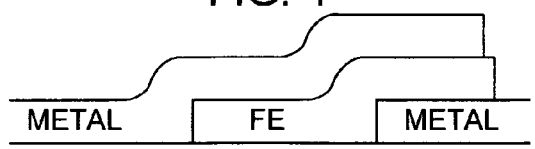
FIG. 4
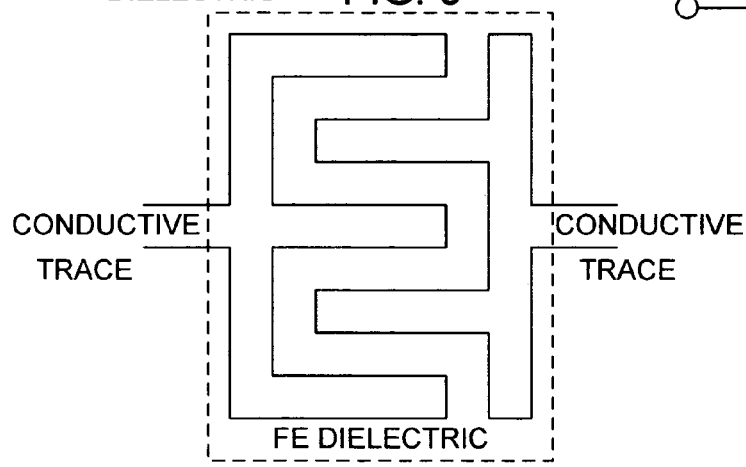
FIG. 5
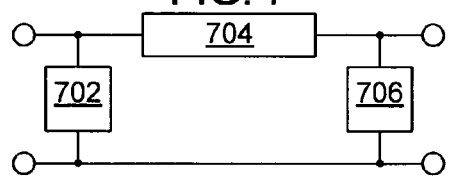
FIG. 7
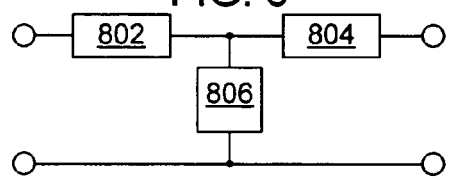
FIG. 8
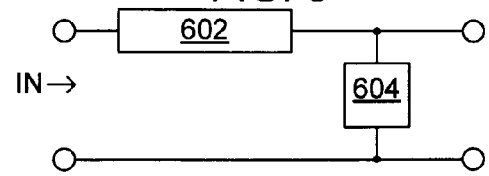
FIG. 6
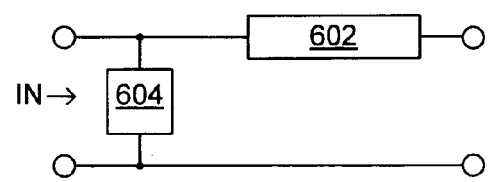

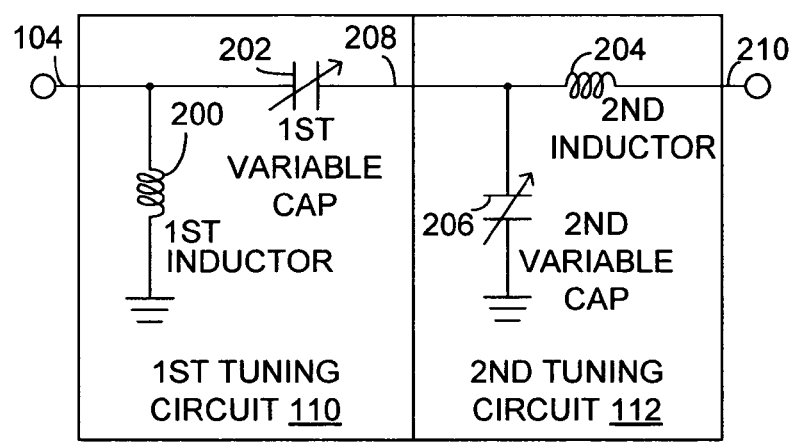
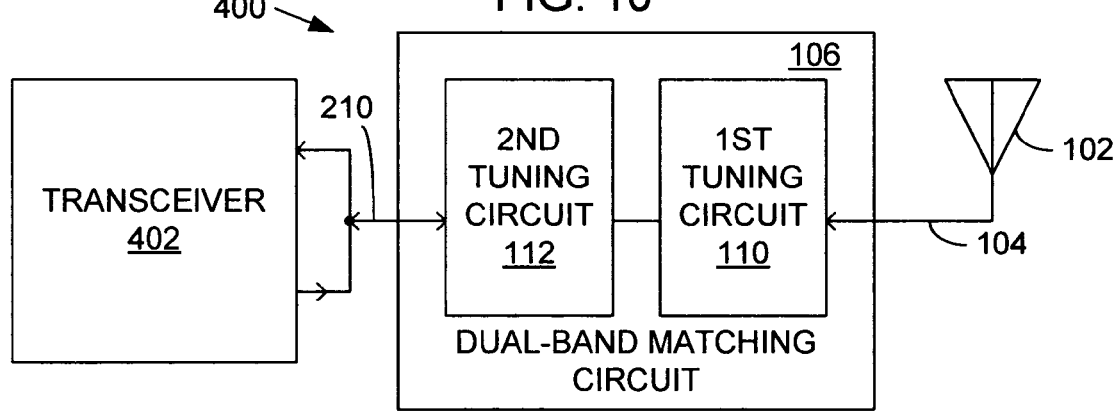

| MARKERS | | | |
|---|---|---|---|
| MARKER # | RESISTANCE | REACTANCE | FREQUENCY |
| 1 | 40.117 Ω | -79.863 Ω | 824 MHz |
| 2 | 28.695 Ω | -66.469 Ω | 894 MHz |
| 3 | 77.234 Ω | 141.53 Ω | 1.575 GHz |
| 4 | 127.98 Ω | -138.57 Ω | 1.850 GHz |
| 5 | 56.914 Ω | -79.410 Ω | 1.990 GHz |

Fig. 13
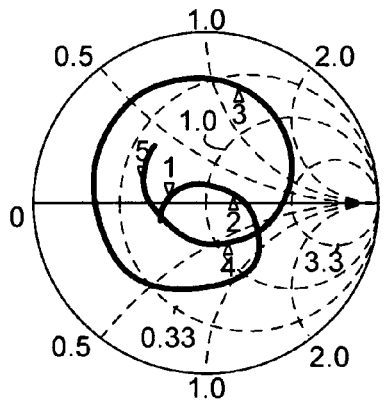
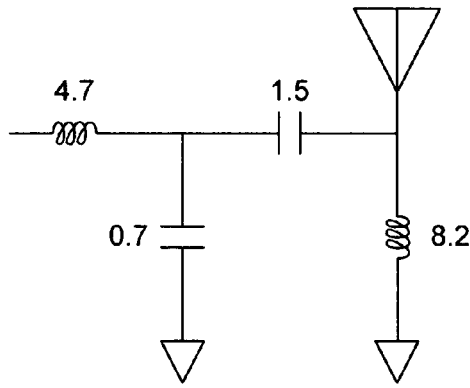
| CH1 MARKERS | | |
|---|---|---|
| MARKER # | RESISTANCE | REACTANCE | FREQUENCY |
| 1 | 29.969 Ω | 1.2969 Ω | 824 MHz |
| 2 | 71.688 Ω | 4.3438 Ω | 894 MHz |
| 3 | 21.143 Ω | 62.543 Ω | 1.575 GHz |
| 4 | 55.148 Ω | -29.227 Ω | 1.850 GHz |
| 5 | 20.845 Ω | 7.9053 Ω | 1.990 GHz |
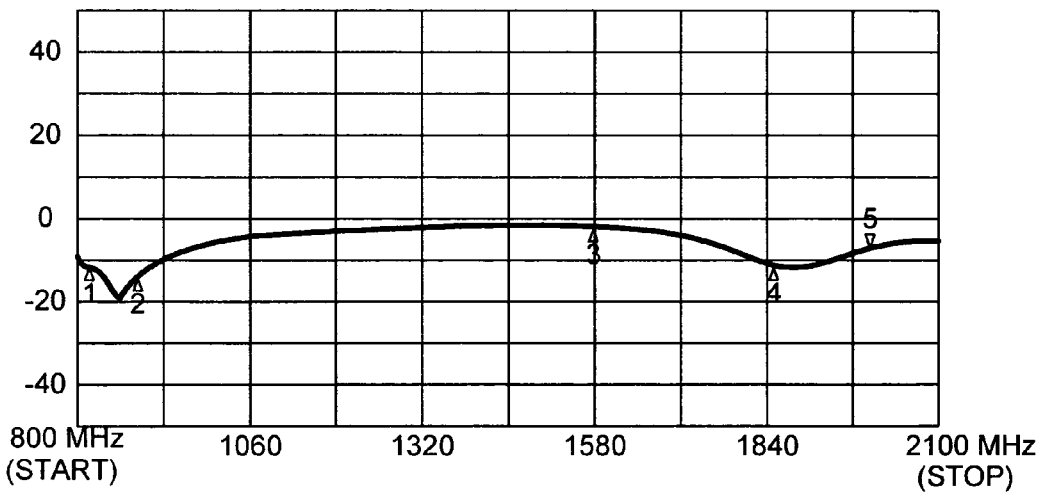
| CH2 MARKERS | | |
|---|---|---|
| MARKER # | GAIN | FREQUENCY |
| 1 | -11.989 dB | 824 MHz |
| 2 | -14.795 dB | 894 MHz |
| 3 | -2.7673 dB | 1.575 GHz |
| 4 | -11.292 dB | 1.850 GHz |
| 5 | -7.458 dB | 1990 MHz |

Fig. 14
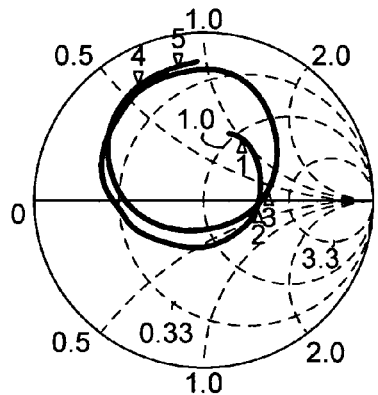
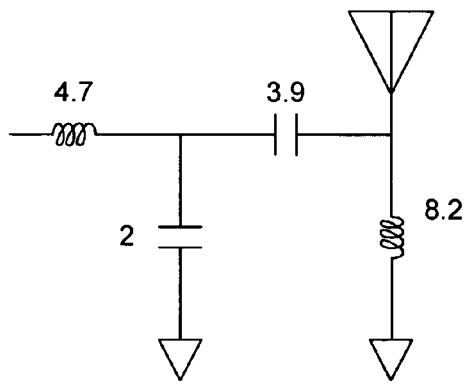
| CH1 MARKERS | | | |
|---|---|---|---|
| MARKER # | RESISTANCE | REACTANCE | FREQUENCY |
| 1 | 56.873 Ω | 47.863 Ω | 824 MHz |
| 2 | 90.313 Ω | -7.4492 Ω | 894 MHz |
| 3 | 99.074 Ω | 5.3477 Ω | 1.575 GHz |
| 4 | 7.4160 Ω | 27.515 Ω | 1.850 GHz |
| 5 | 7.9961 Ω | 39.477 Ω | 1.990 GHz |
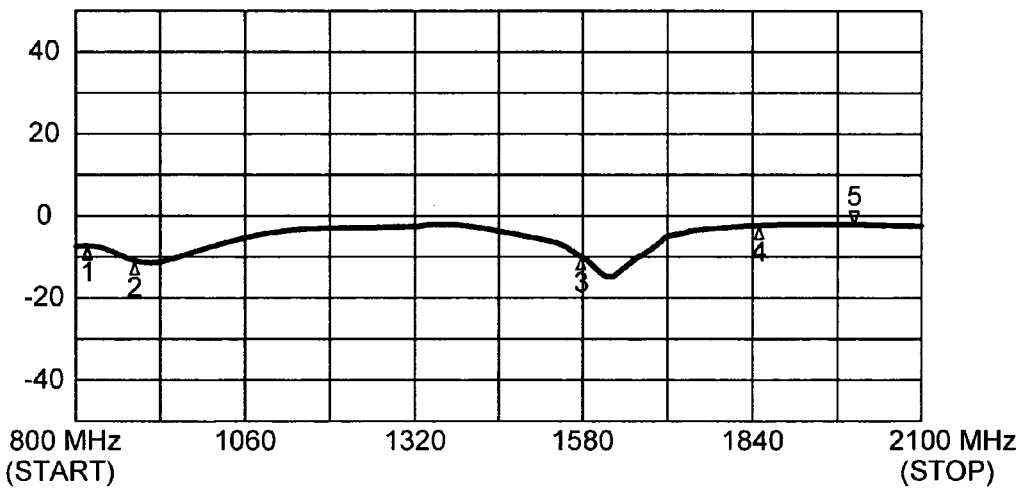
| CH2 MARKERS | | |
|---|---|---|
| MARKER # | GAIN | FREQUENCY |
| 1 | -7.6756 dB | 824 MHz |
| 2 | -10.684 dB | 894 MHz |
| 3 | -9.6003 dB | 1.575 GHz |
| 4 | -1.9785 dB | 1.850 GHz |
| 5 | -1.7069 dB | 1990 MHz |

SYSTEM AND METHOD FOR DUAL-BAND ANTENNA MATCHING

RELATED APPLICATIONS

This application is related to and is a continuation-in-part of U.S. applications "FERROELECTRIC ANTENNA AND METHOD FOR TUNING SAME", Ser. No. 10/117,628, filed on Apr. 4, 2002 now U.S. Pat. No. 6,861,985; "INVERTED-F FERROELECTRIC ANTENNA", Ser. No. 10/120,603, filed on Apr. 9, 2002 now U.S. Pat. No. 6,885,341; and "TUNABLE ANTENNA MATCHING CIRCUIT", Ser. No. 10/075,896, filed on Feb. 12, 2002, now U.S. Pat. No. 6,765,540, all of which are incorporated herein by reference.

This application is related to U.S. APPLICATIONS "TUNABLE HORN ATENNA", Ser. No. 10/122,399, filed on Apr. 12, 2002 now U.S. Pat. No. 6,867,744; "TUNABLE WAVEGUIDE ATENNA", Ser. No. 10/122,968, filed on Apr. 11, 2002 now U.S. Pat. No. 6,741,217; "TUNABLE DIPOLE ANTENNA", Ser. No. 10/121,773, filed on Apr. 11, 2002 now U.S. Pat. No. 6,741,211; and "TUNABLE MATCHING CIRCUIT", Ser. No. 09/927,136, filed on Aug. 10, 2001, all of which are incorporated herein by reference.

This application is also related to the following two U.S. applications filed on the same day as the present application and having the same inventors, and which applications are incorporated herein by reference: "SYSTEM AND METHOD FOR IMPEDANCE MATCHING AN ANTENNA TO SUB-BANDS IN A COMMUNICATION BAND"; and "FULL-DUPLEX ANTENNA SYSTEM AND METHOD".

BACKGROUND OF THE INVENTION

1. Field of the Invention

This invention generally relates to wireless communication antennas and, more particularly, to a dual-band antenna impedance matching system and method that supplies dual-band impedance matches for an antenna.

2. Description of the Related Art

The size of portable wireless communications devices, such as telephones, continues to shrink, even as more functionality is added. As a result, the designers must increase the performance of components or device sub-systems and reduce their size, while packaging these components in inconvenient locations. One such critical component is the wireless communications antenna. This antenna may be connected to a telephone transceiver, for example, or a global positioning system (GPS) receiver.

State-of-the-art wireless telephones are expected to operate in a number of different communication bands. In the US, the cellular band (AMPS), at around 850 megahertz (MHz), and the PCS (Personal Communication System) band, at around 1900 MHz, are used. Other communication bands include the PCN (Personal Communication Network) and DCS at approximately 1800 MHz, the GSM system (Groupe Speciale Mobile) at approximately 900 MHz, and the JDC (Japanese Digital Cellular) at approximately 800 and 1500 MHz. Other bands of interest are GPS signals at approximately 1575 MHz, Bluetooth at approximately 2400 MHz, and wideband code division multiple access (WCDMA) at 1850 to 2200 MHz.

Wireless communications devices are known to use simple cylindrical coil or whip antennas as either the primary or secondary communication antennas. Inverted-F antennas are also popular. The resonance frequency of an antenna is responsive to its electrical length, which forms a portion of the operating frequency wavelength. The electrical length of a wireless device antenna is often at multiples of a quarter-wavelength, such as $5\lambda/4$, $3\lambda/4$, $\lambda/2$, or $\lambda/4$, where $\lambda$ is the wavelength of the operating frequency, and the effective wavelength is responsive to the physical length of the antenna radiator and the proximate dielectric constant.

Conventionally, each wireless device transceiver (receiver and/or transmitter) is connected to a discrete antenna that resonates in a particular communication band. The transceiver may be tuned to channels within the communication band. However, portable wireless devices are becoming available that incorporate a number of transceivers, each operating in a different communication band, or a transceiver that can be tuned to operate in a number of communications bands. A brute-force approach has been to add a different resonator or antenna for each communication band. For example, it is known to stack two microstrip patches with different areas to create non-harmonically related resonant frequency responses. Such a design is not always adequate to cover all the required frequencies (communication bands), however. One work-around solution for the above-mentioned antenna has been to widen the bandpass response of the higher communication band, to cover GPS and PCS communications for example, and to use the lower communication band to resonate at cellular band (AMPS) frequencies. However, the widening of the higher band, to improve GPS and PCS performance, comes at the expense of cellular band performance.

Conventional antenna designs incorporate the use of a dielectric material. Generally speaking, a portion of the field that is generated by the antenna returns to the counterpoise (ground), from the radiator, through the dielectric. The antenna is tuned to be resonant at frequencies, and the wavelength of the radiator, and dielectric constant have an optimal relationship at the resonant frequency. The most common dielectric is air, with a dielectric constant of 1. The dielectric constants of other materials are defined with respect to air.

Ferroelectric materials have a dielectric constant that changes in response to an applied voltage. Because of their variable dielectric constant, ferroelectric materials are good candidates for making tunable components. Conventional measurement techniques, however, have characterized ferroelectric components as substantially lossy, regardless of the processing, doping or other fabrication techniques used to improve their loss properties. They have, therefore, not been widely used. Ferroelectric tunable components operating in RF or microwave regions are perceived as being particularly lossy. This observation is supported by experience in radar applications where, for example, high radio frequency (RF) or microwave loss is the conventional rule for bulk (thickness greater than about 1.0 mm) FE (ferroelectric) materials especially when maximum tuning is desired. In general, most FE materials are lossy unless steps are taken to improve (reduce) their loss. Such steps include, but are not limited to: (1) pre and post deposition annealing or both to compensate for $O_2$ vacancies, (2) use of buffer layers to reduce surfaces stresses, (3) alloying or buffering with other materials and (4) selective doping.

As demand for limited range tuning of lower power components has increased in recent years, the interest in ferroelectric materials has turned to the use of thin film rather than bulk materials. The assumption of high ferroelectric loss, however, has carried over into thin film work as well. Conventional broadband measurement techniques have bolstered the assumption that tunable ferroelectric components, whether bulk or thin film, have substantial loss. In wireless communication matching circuits, for example, a Q of greater than 40, and preferably greater than 180 and, more preferably, greater than 350, is necessary at frequencies of about 2 GHz. These same assumptions apply to the design of antenna interface circuitry and transceivers.

Tunable ferroelectric components, especially those using thin films, can be employed in a wide variety of frequency agile circuits. Tunable components are desirable because they permit circuitry to be tuned in more than one communication band. A tunable component that covers multiple bands potentially reduces the total number of components, as discrete band fixed-frequency components and their associated switches become unnecessary. These advantages are particularly important in wireless handset design, where the need for increased functionality and lower cost and size are seemingly contradictory requirements. With CDMA handsets, for example, performance of individual components is highly stressed. FE materials may also permit integration of RF components that to-date have resisted shrinkage.

Tunable antenna designs have been disclosed in the Related Applications listed above, and are incorporated herein by reference. However, tunable antennas are relatively complex, and more expensive to build than conventional fixed-frequency response antennas.

It would be advantageous if a dual-band antenna system could be made to operate in selectable communication bands.

It would be advantageous if the above-mentioned antenna system could be made to work using an antenna with a fixed impedance. That is, if the communication band selectivity could be performed using a non-tunable antenna.

It would be advantageous if the above-mentioned communication-band selectablity could be obtained by using a tunable antenna matching circuit.

SUMMARY OF THE INVENTION

The present invention describes a dual-band antenna matching system that can be operated in selectable communication bands through the use of a tunable antenna matching circuit. Accordingly, a method is provided for dual-band impedance matching an antenna. The method comprises: accepting a frequency-dependent impedance from an antenna; and, selectively supplying a conjugate impedance match for the antenna at either a first and a second communication band, or a third and a fourth communication band.

More specifically, the method comprises: tuning a first tuning circuit to a first frequency; and, simultaneously tuning a second tuning circuit to a second frequency. In response, a conjugate match is supplied to the antenna in the first communication band in response to the first frequency. Simultaneously, the antenna is matched in the second communication band in response to the second frequency. When, the first tuning circuit is tuned to a third frequency, and the second tuning circuit is tuned to a fourth frequency, then conjugate matches are supplied for the third and fourth communication bands, responsive to the third and fourth frequencies, respectively.

In one aspect, tuning is achieved by: supplying first and second control voltages, respectively, to the first and second tuning circuits; and, adjusting the dielectric constant of a ferroelectric (FE) dielectric material in response to the control voltages. For example, the first tuning circuit may include a first variable capacitor, with a selectable capacitance value, connected to a first inductor with a fixed inductance value. Likewise, the second tuning circuit may include a second variable capacitor, with a selectable capacitance value, connected to a second inductor with a fixed inductance value.

Additional details of the above-described method, a dual-band antenna matching system, and a wireless communications device with a dual-band antenna matching system, are provided below.

BRIEF DESCRIPTION OF THE DRAWINGS

FIG. 1 is a schematic block diagram of the present invention dual-band antenna matching system.

FIGS. 2a and 2b are graphs depicting the relationship between the first, second, third, and fourth communication bands.

FIG. 3 is a plan view of a distributed element gap capacitor.

FIG. 4 is a cross-sectional view of an overlay capacitor.

FIG. 5 is a plan view of an interdigital (IDC) capacitor.

FIG. 6 is a schematic diagram depicting the two possible "L" matching circuit configurations.

FIG. 7 is a schematic diagram depicting a π matching network.

FIG. 8 is a schematic diagram depicting a "T" matching network.

FIG. 9 is a schematic diagram illustrating an exemplary first tuning circuit and an exemplary second tuning circuit.

FIG. 10 is a schematic block diagram of the present invention wireless communications device with a dual-band antenna matching system.

FIG. 13 illustrates the impedance and associated return loss of the antenna of FIG. 12, interfaced to the matching circuit of FIG. 9.

FIG. 14 illustrates the impedance and associated return loss of the antenna of FIG. 12, when the matching circuit first capacitor value is 4 pf and second capacitor value is 2 pf.

DETAILED DESCRIPTION OF THE PREFERRED EMBODIMENTS

Figure 11:
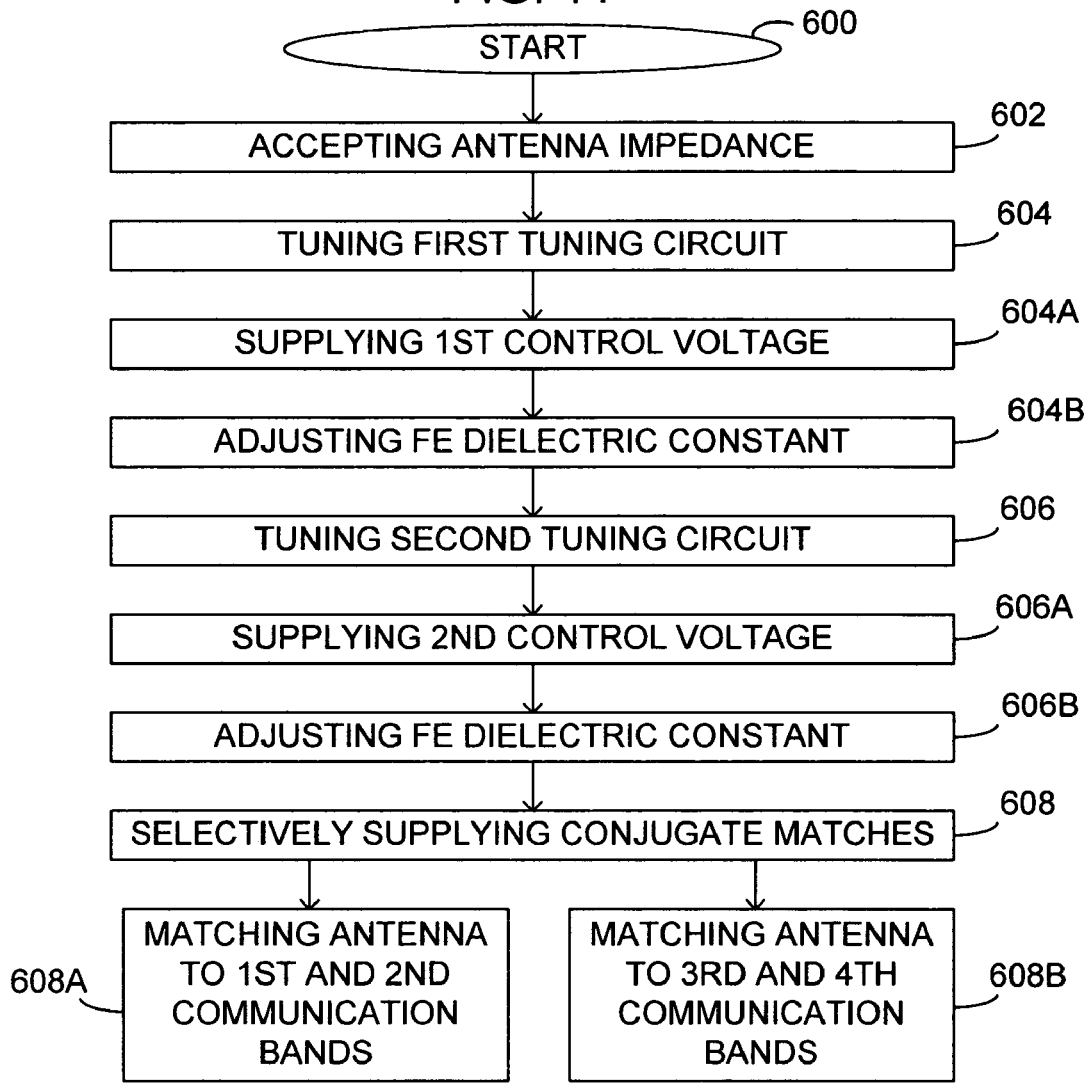
FIG. 11 is a flowchart illustrating the present invention method for dual-band impedance matching an antenna.

FIG. 1 is a schematic block diagram of the present invention dual-band antenna matching system. The system 100 comprises an antenna 102 having an interface port on line 104 with a frequency-dependent impedance. A dual-band matching circuit 106 includes an output port connected to the antenna interface port on line 104. Line 104 can be a transmission line, for example. The dual-band matching circuit 106 selectively supplies a conjugate impedance at a first and a second communication band. Alternately, the dual-band matching circuit 106 supplies a conjugate match at a third and a fourth communication band. Typically, the antenna has a fixed impedance that varies with respect to frequency or communication band. However, in one aspect of the system, the antenna can be frequency tunable to further the dual-band matching process.

Specifically, the dual-band matching circuit 106 supplies a conjugate impedance at the first communication band in response to a first tuned frequency, and simultaneously at the second communication band in response to a second tuned frequency. Alternately, the dual-band matching circuit 106 supplies a conjugate impedance at the third communication band in response to a third tuned frequency, and simultaneously at the fourth communication band in response to a fourth tuned frequency.

The present invention is useful for a person who owns a cell phone that operates in the cell band at 824 to 894 MHz, for example, when they are home. On travel, the user's network may operate in a different band, for example the GSM 880–960 MHz band. Conventionally, the user has had to own two phones, one for home and one for travel. The present invention permits the user cell phone to operate efficiently in either environment, by selecting the conjugate match to the antenna. Alternately, the selective conjugate match can be used to permit a cell phone to efficiently use a common antenna for both phone and GPS communications, to support 911 or location-based services.

FIGS. 2a and 2b are graphs depicting the relationship between the first, second, third, and fourth communication bands. It should be understood that an antenna will function to some extent, even if poorly matched. Alternately, the antenna may be well matched, but have poor efficiencies at one or more of the communication bands. Some conventional antenna/matching circuit designs are able to cover multiple communication bands by providing a poor antenna match to an efficient antenna at one, or more frequencies. A poorly matched antenna is likely to have a lossy interface, or suffer with a greater reflected power (lower power throughput to/from the matching circuit).

Other conventional antenna/matching systems offer wideband performance by conjugately matching an antenna that is inefficient at one, or more frequencies of interest. Inefficient antennas may have a poor gain. The use of a poorly matched or inefficient antenna may result in a lower receiver sensitivity, so that low-power input signals are missed. Alternately, the use of a poorly matched or inefficient antenna may result in a lower power transmit signal, forcing the transmitter to compensate with the use of additional battery power.

With the present invention matching circuit, the antenna is matched with a return loss, or voltage standing wave ratio (VSWR) of less (better) than 2:1, simultaneously in the first and second communication bands. That is, less than approximately 1/10 of the communicated power is reflected at the antenna/matching circuit interface. Further, the dual-band matching circuit simultaneously supplies matches in the third and fourth communication bands having a return loss of less (better) than 2:1.

In FIG. 2a, the first, second, third, and fourth communication bands cover different frequency ranges. Note that although that the communications bands are shown with a frequency separation between bands, in some aspects the communication bands may overlap a common frequency span or be adjoined. Also note that a communication band may have a frequency span that is large enough to cover a plurality of communication channels. In FIG. 2b, the first and third communications bands cover the same frequency span. The third communication band is represented in phantom by dotted lines.

It should be understood that the antenna is unlikely to provide a constant impedance across all the frequencies of interest. The antenna is likely to have a complex impedance, a combination of resistance and reactance (imaginary impedance), and that the complex impedance will vary across the communications bands. However, since the impedance of the antenna is fixed, the conjugate impedances in the first, second, third, and fourth communication bands (frequency bands) can be determined. The matching circuit is able to supply a conjugate impedance to the antenna for each frequency (band) of interest. Alternately stated, the matching circuit is likely to supply a different conjugate match (complex impedance) for each communication band.

A conjugate impedance is understood to have the same real value, and opposite imaginary value, of the impedance to which it is matched. For example, for an antenna impedance value of (25+13j) ohms in the center of the first communication band, the conjugate impedance is (25−13j) ohms. A perfect conjugate match is rare, expect at specific frequencies. Therefore, a conjugate match is typically optimizing for the center of a communication match, and/or efforts are made to have the matching circuit impedance track the antenna impedance across a frequency span. While it is theoretically possible to build a matching circuit to provide a conjugate match to any impedance, it should be understood that the antenna may incorporate some fixed-tuning elements or structures that provide convenient (easy to match) impedances in the first, second, third, and fourth communications bands. It should be understood that in the some aspects an antenna and antenna matching circuit may be combined into a single circuit referred to as an "antenna".

Returning to FIG. 1, the dual-band matching circuit 106 includes a first tuning circuit 110 selectively tunable to the first and third frequencies and a second tuning circuit 112 selectively tunable to the second and fourth frequencies. The first and second tuning circuits 110/112 are shown in the figure as series-connected, however, a parallel arrangement of tuners is also possible. The first and second tuning circuits 110/112 may each include a ferroelectric (FE) dielectric material (not shown) having a variable dielectric constant responsive to a control voltage. In one aspect, there is a linear relationship between the dielectric constant and the control voltage. In another aspect, the relationship is more linear than voltage/capacitance curve of a voractor diode, especially in the tuning range between 0 and 3 V. Some details of FE dielectric characteristics were presented in the Background Section, above. The first and second tuning circuits 110/112 have interfaces on lines 114 and 116, respectively, to receive the control voltage. In some aspects, the first and second tuning circuits 110/112 accept a control voltage in the range between zero and three volts dc. This range of control voltages is compatible with the conventional battery sources used to power portable wireless devices. The ferroelectric variable capacitor may be an interdigital (IDC), gap, or overlay capacitor.

Generally, matching circuits can be implemented using lumped elements, distributed network elements, or some combination of the two. With distributed element matching, thin or thick FE films can be used in planar (microstrip, stripline, CPW, among others) passive matching circuits to vary the permittivity of the underlying substrate, thus effecting a change in the matching circuit's or resonator's electrical length or characteristic impedance. The use of planar matching circuits is familiar to anyone trained in the art of amplifier or circuit design. The matching networks here can be hybrids and couplers, as well as the more conventional distributed inductive and capacitive structures. If lumped element matching components are used, then FE based tunable capacitors can be used in a similar manner to effect change. The linear dielectric variance, high Q, and low current consumption associated with FE capacitors, make them desirable when compared to conventional tunable components, such as voractor diodes.

FIG. 3 is a plan view of a distributed element gap capacitor. Compared to an IDC, the gap capacitor has a better Q, but lower capacitance per unit cross section (W). The IDC's capacitance is greater due to the use of a number of fingers per unit cross section. For many communication filter applications, however, large capacitance (C≧4.0 pF) is not needed. Thus, a gap capacitor often can provide adequate capacitance. The inherently high value of κ for most FE films helps provide relatively high capacitance per unit cross-section, W, compared to a conventional gap capacitor.

FIG. 4 is a cross-sectional view of an overlay capacitor. In comparison to gap and interdigital capacitors, an overlay capacitor has the lowest $L_{geom}$. An overlay capacitor is an example of a parallel plate geometry where the plate dimensions (length and width) are much greater than the plate separation. Given such a geometry, most of the electric field between the plates is uniform except for fringing along the edges. The fringing effect can be reduced significantly by the use of a guard band, as is well known in the art. Thus, the geometric loss from a parallel plate capacitor is quite low. In addition, parallel plate geometries can provide high capacitances along with high tuning from small control voltage swings.

FIG. 5 is a plan view of an interdigital (IDC) capacitor. For a given cross-sectional area, an IDC can provide a higher capacitance than a gap capacitor. Loss increases as the gap spacing decreases. Similarly, loss increases as finger width decreases. The finger length also affects loss with loss increasing as finger length increases; especially in a microstrip realization of an IDC, as the odd mode loss dominates in such a structure. In addition, loss increases as the number of fingers increases, due to loss introduced from the additional sharp corners. Note that an increase in the number of fingers is typically associated with an increase in the capacitance of an IDC.

FIG. 6 is a schematic diagram depicting two possible "L" matching circuit configurations. The two reactive elements 602 and 604 may be any combination of capacitors and/or inductors.

FIG. 7 is a schematic diagram depicting a π matching network. Again, the reactive elements 702, 704, and 706 may be any combination of capacitors and/or inductors.

FIG. 8 is a schematic diagram depicting a "T" matching network. Again, the reactive elements 802, 804, and 806 may be any combination of capacitors and/or inductors.

In the simplest form, the dual-band matching circuit of the present invention may be enabled using a tunable series element or a tunable shunt element, such as a capacitor or inductor. Alternately, the dual-band matching circuit any be an "L", π, "T", or combinations of the above-mentioned topologies. The dual-band matching circuit is not limited to any particular topology.

FIG. 9 is a schematic diagram illustrating an exemplary first tuning circuit 110 and an exemplary second tuning circuit 112. The first tuning circuit 110 includes a first inductor 200 with a fixed inductance value, and a first variable capacitor 202 with a selectable capacitance value. The second tuning circuit 112 likewise includes a second inductor 204 with a fixed inductance value, and a second variable capacitor 206 with a selectable capacitance value.

The first inductor 200 is connected in shunt between the dual-band circuit output port on line 104 and a reference voltage. For example, the reference voltage may be ground. The first variable capacitor 202 has a first terminal connected to the dual-band circuit output port on line 104. The second inductor 204 is connected in series between a second terminal of the first variable capacitor on line 208 and a dual-band matching circuit input port on line 210. The second variable capacitor 206 has a first terminal connected in shunt between the first variable capacitor second terminal on line 208 and the reference voltage.

It should be understood that the invention may be enabled with other components and circuit topologies than the ones shown in FIG. 9. Further, additional components, with either fixed or variable values, can be added to increase the number of poles, giving the circuits greater tunability and/or a sharper frequency response.

An example follows with particular component values for use in selecting a particular set of communication bands. In this example the first inductor 200 has an inductance of 8.2 nano-Henrys (nH) and the first variable capacitor 202 has a capacitance in the range between 1.5 and 4 picofarads (pF). The second inductor 204 has an inductance of 4.7 nH. The second variable capacitor 206 has a capacitance in the range between 0.7 and 2 pF.

Using the above-mentioned first tuning circuit values, the first frequency is responsive to the first variable capacitor having a value of 1.5 pF, and the third frequency is responsive to the value of 4 pF. Using the second tuning circuit values, the second frequency is responsive to the second variable capacitor having a value of 0.7 pF, and the fourth frequency is responsive to the value of 2 pF.

In this particular example, the first and third communication bands are the same (see FIG. 2b). That is, the matching circuit provides impedance matches for the first and second communications bands, or the first (third) and fourth communications bands. In one aspect, the dual-band matching circuit supplies conjugate impedances at a first (third) communication band in the range between 824 and 894 megahertz (MHz), at a second communication band in the range of 1850 and 1990 MHz, and at a fourth communication band in the range of 1565 to 1585 MHz.

Figure 12:
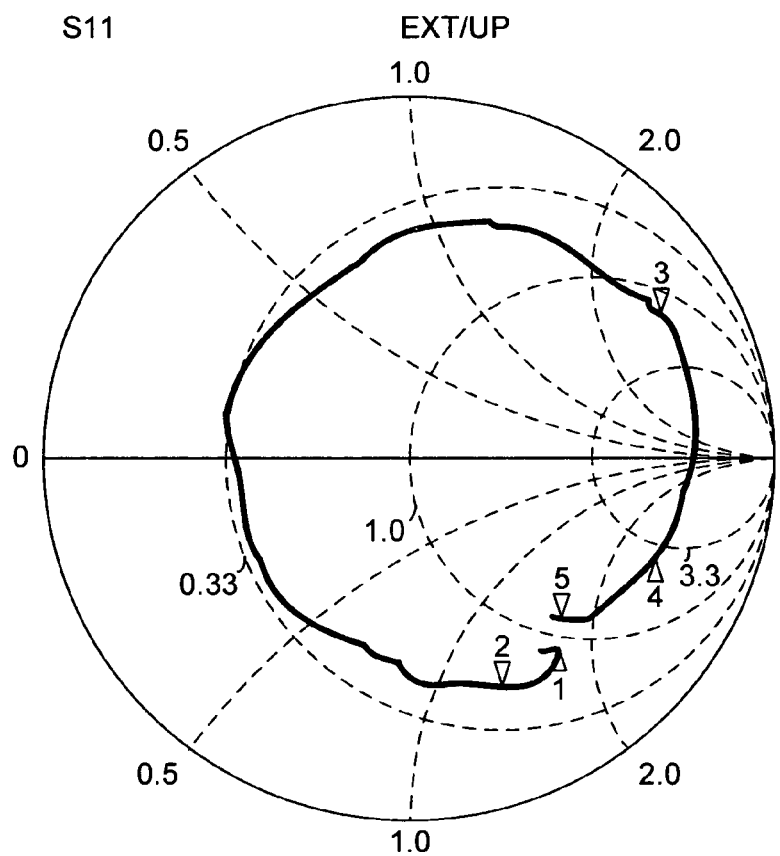
FIG. 12 is a Smith chart drawing depicting an exemplary antenna impedance, as charted between 824 and 1850 MHz.

FIG. 12 is a Smith chart drawing depicting an exemplary antenna impedance, as charted between 824 and 1850 MHz.

FIG. 13 illustrates the impedance and associated return loss of the antenna of FIG. 12, interfaced to the matching circuit of FIG. 9. The matching circuit first capacitor value is 1.5 pf and second capacitor value is 0.7 pf. Conjugate impedances are supplied at approximately 850 and 1900 MHz.

FIG. 14 illustrates the impedance and associated return loss of the antenna of FIG. 12, when the matching circuit first capacitor value is 4 pf and second capacitor value is 2 pf. Conjugate impedances are supplied at approximately 850 and 1575 MHz.

Alternately, the first and third communications bands cover different frequency ranges. For example, the dual-band matching circuit can supply conjugate impedances at a first communication band in the range between 824 and 894 MHz, at a second communication band in the range of 1850 and 1990 MHz, at a third communication band in the range of 880 to 960 MHz, and at a fourth communication band in the range of 1710 to 1880 MHz. The matching circuit can also supply conjugate impedances in the UMTS band between 1850 and 2200 MHz is also Other communication bands, bandwidths, and bandwidth spacings may be obtained by selecting different component values in the first and second tuning circuits. Further, it would be possible to modify the matching circuit concept developed above to create a matching circuit that is able to tune a multi-band antenna (i.e., a tri-band antenna) between different communications bands. Likewise, the concept can be extended to a matching circuit that is able provide dual-band conjugate matches for a plurality of communication band combinations (more than 2 sets of dual-band combinations). Although the exemplary tuning circuits are enabled with FE capacitors, it is possible to build the circuits with conventional variable components, such as voractor diodes or mechanically tunable capacitors, or a combination of FE and conventional variable components.

FIG. 10 is a schematic block diagram of the present invention wireless communications device with a dual-band antenna matching system. The device 400 comprises a transceiver 402 having a wireless communications port on line 210 to communicate in a first, second, third, and fourth communication band. An antenna 102 has an interface port on line 104 with a frequency-dependent impedance. A dual-band matching circuit 106 includes an input port connected to the transceiver wireless communications port on line 210 and an output port connected to the antenna interface port on line 104. The dual-band matching circuit 106 selectively supplies a conjugate impedance at either the first and second communication band, or the third and fourth communication band.

As described above in the explanation of FIG. 1, the dual-band matching circuit 106 supplies a conjugate impedance for the first communication band in response to a first tuned frequency, and simultaneously for the second communication band in response to a second tuned frequency. Alternately, the dual-band matching circuit 106 supplies a conjugate impedance for the third communication band in response to a third tuned frequency, and simultaneously for the fourth communication band in response to a fourth tuned frequency. The dual-band matching circuit further includes a first tuning circuit 110 selectively tunable to the first and third frequencies, and a second tuning circuit 112 selectively tunable to the second and fourth frequencies. Details of the first and second tuning circuits 110 and 112 have been provided above, and will not be repeated in the interest of brevity.

In one aspect of the invention, the first and third communication bands are transmission bandwidths, while the second and fourth communication bands are receive bandwidths. In this aspect, the transceiver 402 incorporates transmit and receive functions. In another aspect, all four communication bands are either receiver or transmission bandwidths. The communication bands may support telephone, Bluetooth, GPS, and radio communications. Typically, the transceiver 402 is selectively tuned to relatively narrow channels. Each communication band typically includes a plurality of frequency-consecutive channels.

As in the exemplary circuit described in FIG. 1, the dual-band matching circuit 106 may supply conjugate impedances at either the first and second communication band, or the third and fourth communication band, where the first and third communication bands are the same. For example, the dual-band matching circuit 106 may supply conjugate impedances at a first (third) communication band in the range between 824 and 894 megahertz (MHz), at a second communication band in the range of 1850 and 1990 MHz, and at a fourth communication band in the range of 1565 to 1585 MHz.

Alternately, the first and third communication bands cover different frequency ranges and the dual-band matching circuit 106 supplies conjugate impedances at a first communication band in the range between 824 and 894 megahertz (MHz), at a second communication band in the range of 1850 and 1990 MHz, at a third communication band in the range of 880 to 960 MHz, and at a fourth communication band in the range of 1710 to 1880 MHz.

Other communication bands, bandwidths, and bandwidth spacings may be obtained by selecting different component values in the first and second tuning circuits. Further, it would be possible to extend the matching circuit concept developed above to a matching circuit that is able to tune a multi-band antenna between different communications bands. Likewise, the concept can be extended to a matching circuit that is able provide dual-band conjugate matches for a plurality of communication band combinations. Although the exemplary tuning circuits are enabled with FE capacitors, it is possible to build the circuits with conventional variable components, or a combination of FE and conventional variable components.

FIG. 11 is a flowchart illustrating the present invention method for dual-band impedance matching an antenna. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 600.

Step 602 accepts a frequency-dependent impedance from an antenna. Step 608 selectively supplies a conjugate impedance match for the antenna at either a first and a second communication band, or a third and a fourth communication band. In some aspects, Step 608 uses a matching topology such as a series tunable element, a shunt tunable element, an "L" network, a π network, a "T" network, or combinations of the above-mentioned topologies.

In some aspects of the method, Step 604 tunes a first tuning circuit to a first frequency. Step 606 simultaneously tunes a second tuning circuit to a second frequency. Then, selectively supplying the conjugate impedance for matching the antenna at the first and second communication bands includes a Step 608a that matches the antenna at the first communication band in response to the first frequency, and simultaneously matches the antenna at the second communication band in response to the second frequency.

In other aspects Step 604 tunes the first tuning circuit to a third frequency and Step 606 tunes the second tuning circuit to a fourth frequency. Then, a Step 608b matches the antenna at the third communication band in response to the third frequency, and simultaneously matches the antenna at the fourth communication band in response to the fourth frequency.

In other aspects, Step 604 and Step 606 include substeps. Step 604a supplies a first control voltage to the first tuning circuits, and Step 604b adjusts the dielectric constant of a ferroelectric (FE) dielectric material in response to the control voltages. Likewise, Step 606a supplies a second control voltage to the second tuning circuits, and Step 606b adjusts the dielectric constant of an FE dielectric material in response to the control voltages. In one aspect, there is a linear relationship between the dielectric constant and the control voltage. In another aspect, the relationship is more linear than voltage/capacitance curve of a voractor diode, especially in the tuning range between 0 and 3 V.

In some aspects, the first tuning circuit (in Step 604) tunes a first variable capacitor, with a selectable capacitance value, connected to a first inductor with a fixed inductance value. Likewise, in Step 606 the second tuning circuit tunes a second variable capacitor, with a selectable capacitance value, connected to a second inductor with a fixed inductance value.

For example, Step 604 may include tuning a first variable capacitor with a selectable capacitance value in the range between 1.5 and 4 picofarads (pF), connected to a first inductor with a fixed inductance value of 8.2 nano-Henrys (nH). Step 606 may include tuning a second variable capacitor with a selectable capacitance value in the range of 0.7 and 2 pF, connected to a second inductor with a fixed inductance value of 4.7 nH. To continue the example, Step

604 tunes the first frequency by using a first variable capacitor value of 1.5 pF, and tunes to the third frequency by using a first variable capacitor value of 4 pF. In Step 606, the second tuning circuit tunes to the second frequency by using a second variable capacitor value of 0.7 pF, and tunes to the fourth frequency using a second variable capacitor value of 2 pF. In this example, Step 608*a* matches the antenna to a first communication band in the range of 824 to 894 MHz and a second communication band in the range of 1850 to 1990 MHz (using the first and second frequencies, respectively). Alternately, Step 608*b* matches the antenna to a third communication band in the range of 824 to 894 MHz a fourth communication band in the range of 1565 to 1585 MHz. In this particular example, the first and third communication bands are the same.

In another example where the first and third communication bands cover different frequencies, Step 608*a* may match the antenna to a first communication band in the range of 824 to 894 MHz and a second communication band in the range of 1850 to 1990 MHz. In the alternative, Step 608*b* matches the antenna to a third communication band in the range of 880–960 MHz a fourth communication band in the range of 1710–1880 MHz.

A dual-band antenna matching system, a wireless device using the dual-band matching system, and a method for dual-band antenna matching have been provided. Exemplary component values, circuit configurations, and frequencies have been presented to clarify the invention. However, the invention is not necessarily limited to just these examples. Variable value electrical components have also been presented using FE materials. However, it would be possible to enable the invention using conventional components, or a combination of conventional and FE components. Further, tunings changes can also be enabled when FE material is used as a circuit board dielectric, to change the electrical length of a microstrip inductor for example. Other variations and embodiments of the invention will occur to those skilled in the art.

We claim:

1. A dual-band antenna system for wireless communication of signals in a plurality of communication bands, the system comprising:
   an antenna having an interface port with a frequency-dependent impedance; and,
   a dual-band matching circuit including an output port connected to the antenna interface port, the dual-band matching circuit comprising:
      a first tuning circuit selectively tunable within a first communication band of the plurality of communication bands and selectively tunable within a third communication band of the plurality of communication bands, the first tuning circuit comprising a first tunable ferroeclectric (FE) capacitor having a first variable dielectric constant responsive to first control voltage; and
      a second tuning circuit selectively tunable within a second communication band of the plurality of communication bands when the first tuning circuit is tuned to the first communication band and selectively tunable within a fourth communication band of the plurality of communication bands when the first tuning circuit is tuned to the third communication band, the second tuning circuit comprising a second tunable FE capacitor having a second variable dielectric constant responsive to a second control voltage;
   wherein the first tuning circuit and the second tuning circuit supply a first conjugate impedance for the first and second communication bands and supply a second conjugate impedance for the third and fourth communication bands.

2. The system of claim 1 wherein first and second tuning the first control voltage and the second control voltage are in the range between zero and three volts dc.

3. The system of claim 1 wherein the first and second tunable ferroelectric capacitors are selected from the group including interdigital, gap, and overlay capacitors.

4. The system of claim 1 wherein the first tuning circuit includes:
   a first inductor with a fixed inductance value;
   the first tunable FE capacitor with a selectable capacitance value; and,
wherein the second tuning circuit includes:
   a second inductor with a fixed inductance value;
   the second tunable FE capacitor with a selectable capacitance value.

5. The system of claim 4 wherein the first inductor is connected in shunt between the dual-band matching circuit output port and a reference voltage;
   wherein the first tunable FE capacitor has a first terminal connected to the dual-band matching circuit output port;
   wherein the second inductor is connected in series between a second terminal of the first tunable FE capacitor and a dual-band matching circuit input port; and,
   wherein the second tunable FE capacitor has a first terminal connected in shunt between the first tunable FE capacitor second terminal and the reference voltage.

6. The system of claim 5 wherein the first inductor has an inductance of 8.2 nano-Henrys (nH);
   wherein the first tunable FE capacitor has a capacitance in the range between 1.5 and 4 picofarads (pF);
   wherein the second inductor has an inductance of 4.7 nH
   wherein the second tunable FE capacitor has a capacitance in the range between 0.7 and 2 pF.

7. The system of claim 6 wherein the first frequency is responsive to the first tunable FE capacitor having a value of 1.5 pF, and the third frequency is responsive to the value of 4 pF; and,
   wherein the second frequency is responsive to the second tunable FE capacitor having a value of 0.7 pF, and the fourth frequency is responsive to the value of 2 pF.

8. The system of claim 1 wherein
   the first communication band and the third communication band are the same.

9. The system of claim 8 wherein the first (third) communication band is in the range between 824 and 894 megahertz (MHZ), the second communication band is in the range of 1850 and 1990 MHz, and the fourth communication band is in the range of 1565 to 1585 MHz.

10. The system of claim 1 wherein the first communication band is in the range between 824 and 894 megahertz (MHz), the second communication band is in the range of 1850 and 1990 MHz, the third communication band is in the range of 880 to 960 MHz, and the fourth communication band is in the range of 1710 to 1880 MHz.

11. The system of claim 1 wherein the dual-band matching circuit is a matching topology selected from the group including a tunable series element, a tunable shunt element, "L", π, "T", and combinations of the above-mentioned topologies.

12. The system of claim 1 wherein the dual-band matching circuit supplies the first conjugate impedance for the first and second communication bands having a return loss of better than 2:1; and, supplies the second conjugate impedance for the third and fourth communication bands having a return loss of better than 2:1.

13. A wireless communications device with a dual-band antenna matching system, the device comprising:

a transceiver having a wireless communications port to communicate in a first, a second, a third, and a fourth communication band;

an antenna having an interface port with a frequency-dependent impedance;

a dual-band matching circuit including an input port connected to the transceiver wireless communications port and an output port connected to the antenna interface port, the dual-band matching circuit selectively supplying a first conjugate impedance for the first and a second communication band and a second conjugate impedance for the third and a fourth communication band, the dual-band matching circuit comprising:

a first tuning circuit selectively tunable within the first and third communication bands utilizing a first ferroelectric (FE) capacitor responsive to a first control voltage; and a second tuning circuit selectively tunable within the second and fourth communication bands utilizing a second ferroelectric (FE) capacitor responsive to a second control voltage.

14. The device of claim 13 wherein the first and second control voltages are in the range between zero and three volts dc.

15. The device of claim 13 wherein the first and second FE capacitors are selected from the group including interdigital, gap, and overlay capacitors.

16. The device of claim 13 wherein the first tuning circuit includes:

a first inductor with a fixed inductance value; and
the first FE capacitor with a selectable capacitance value; and, wherein the second tuning circuit includes:

a second inductor with a fixed inductance value; and
the second FE capacitor with a selectable capacitance value.

17. The device of claim 16 wherein the first inductor is connected in shunt between the dual-band circuit output port and a reference voltage;

wherein the first FE capacitor has a first terminal connected to the dual-band circuit output port;

wherein the second inductor is connected in series between a second terminal of the first FE capacitor and a dual-band matching circuit input port; and, wherein the second FE capacitor has a first terminal connected in shunt between the first FE capacitor second terminal and the reference voltage.

18. The device of claim 17 wherein the first inductor has an inductance of 8.2 nano-Henrys (nH);

wherein the first FE capacitor has a capacitance in the range between 1.5 and 4 picofarads (pF);

wherein the second inductor has an inductance of 4.7 nH; and, wherein the second FE capacitor has a capacitance in the range between 0.7 and 2 pF.

19. The device of claim 18 wherein the first frequency is responsive to the first FE capacitor having a value of 1.5 pF, and the third frequency is responsive to the value of 4 pF; and, wherein the second frequency is response to the second FE capacitor having a value of 0.7 pF, and the fourth frequency is responsive to the value of 2 pF.

20. The device of claim 13 wherein the first and third communication bands are the same.

21. The device of claim 20 wherein the first (third) communication band is in the range between 824 and 894 megahertz (MHz), the second communication band is in the range of 1850 and 1990 MHz, and the fourth communication band is in the range of 1565 to 1585 MHz.

22. The device of claim 13 wherein first communication band is in the range between 824 and 894 megahertz (MHz), the second communication band is in the range of 1850 and 1990 MHz, the third communication band is in the range of 880 to 960 MHz, and the fourth communication band is in the range of 1710 to 1880 MHz.

23. The device of claim 13 wherein the dual-band matching circuit is a matching topology selected from the group including a tunable series element, a tunable shunt element, "L", π, "T", and combinations of the above-mentioned topologies.

24. The device of claim 13 wherein the dual-band matching circuit supplies the first conjugate impedance for the first and second communication bands having a return loss of better than 2:1; and, supplies the second conjugate impedance for the third and fourth communication bands having a return loss of better than 2:1.

* * * * *

UNITED STATES PATENT AND TRADEMARK OFFICE
CERTIFICATE OF CORRECTION

| | | |
|---|---|---|
| PATENT NO. | : 7,180,467 B2 | Page 1 of 1 |
| APPLICATION NO. | : 10/899278 | |
| DATED | : February 20, 2007 | |
| INVENTOR(S) | : Fabrega-Sanchez et al. | |

It is certified that error appears in the above-identified patent and that said Letters Patent is hereby corrected as shown below:

In column 11, line 55, after "to" insert --a--.

In column 12, line 6, after "wherein", delete "first and second tuning".

Signed and Sealed this

Fourth Day of September, 2007

JON W. DUDAS
*Director of the United States Patent and Trademark Office*